United States Patent
Xia et al.

(10) Patent No.: US 8,611,380 B2
(45) Date of Patent: *Dec. 17, 2013

(54) SYSTEM AND METHOD FOR DIGITAL COMMUNICATIONS USING MULTIPLE PARALLEL ENCODERS

(75) Inventors: Pengfei Xia, Mountain View, CA (US); Huaning Niu, Sunnyvale, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/457,379

(22) Filed: Apr. 26, 2012

(65) Prior Publication Data

US 2012/0207223 A1 Aug. 16, 2012

Related U.S. Application Data

(63) Continuation of application No. 11/724,758, filed on Mar. 15, 2007, now Pat. No. 8,189,627.

(60) Provisional application No. 60/817,317, filed on Jun. 28, 2006.

(51) Int. Cl.
*H04J 3/04* (2006.01)

(52) U.S. Cl.
USPC ............ 370/535; 714/784; 714/756; 714/762

(58) Field of Classification Search
USPC ............... 370/533–537; 375/240.01; 714/784
See application file for complete search history.

(56) References Cited

U.S. PATENT DOCUMENTS

| | | | |
|---|---|---|---|
| 4,907,233 A | 3/1990 | Deutsch et al. |
| 5,337,087 A | 8/1994 | Mishima |
| 5,508,752 A | 4/1996 | Kim et al. |
| 6,717,908 B2 | 4/2004 | Vijayan et al. |
| 6,718,503 B1 | 4/2004 | Lerner et al. |

(Continued)

FOREIGN PATENT DOCUMENTS

| | | |
|---|---|---|
| EP | 0537932 A2 | 4/1993 |
| JP | 2001251199 | 9/2001 |

(Continued)

OTHER PUBLICATIONS

Chinese Office Action dated Dec. 14, 2010 for Chinese Patent Application No. 200880015683.0, pp. 1-3, China Patent Office, People's Republic of China (English-language translation is attached, 4 pages).

(Continued)

*Primary Examiner* — Gary Mui
(74) *Attorney, Agent, or Firm* — Kenneth L. Sherman, Esq.; Michael Zarrabian, Esq.; Sherman & Zarrabian LLP

(57) ABSTRACT

Devices and methods for processing wireless high definition video data to be communicated in an uncompressed format over a wireless medium is disclosed. In one embodiment, an encoder includes a first outer encoder that encodes a first portion of a video data stream. A second outer encoder encodes a second portion of the video data stream. A first parser parses the first encoded data stream into first sub-video data streams. A second parser parses the second encoded data stream into second sub-video data streams.

25 Claims, 6 Drawing Sheets

(56) References Cited

U.S. PATENT DOCUMENTS

| | | |
|---|---|---|
| 6,724,327 B1 | 4/2004 | Pope et al. |
| 7,133,441 B1 | 11/2006 | Barlev et al. |
| 7,135,997 B2 | 11/2006 | Oh |
| 7,295,627 B2 | 11/2007 | Kim et al. |
| 7,388,915 B2 | 6/2008 | Cho et al. |
| 7,453,929 B2 | 11/2008 | Barlev et al. |
| 7,499,462 B2 | 3/2009 | MacMullan et al. |
| 7,610,457 B2 | 10/2009 | Lee |
| 7,680,269 B2 | 3/2010 | Nicolai et al. |
| 7,688,908 B2 | 3/2010 | Niu et al. |
| 7,965,837 B2 | 6/2011 | Kawasaki et al. |
| 8,014,416 B2 | 9/2011 | Ho et al. |
| 8,111,670 B2 | 2/2012 | Niu et al. |
| 2004/0047424 A1 | 3/2004 | Ramaswamy et al. |
| 2005/0047519 A1* | 3/2005 | Kim et al. ............ 375/295 |
| 2006/0005106 A1 | 1/2006 | Lane et al. |
| 2006/0082274 A1 | 4/2006 | Song |
| 2006/0107171 A1 | 5/2006 | Skraparlis |
| 2006/0280256 A1 | 12/2006 | Kwon et al. |
| 2008/0123739 A1 | 5/2008 | Reznic et al. |
| 2008/0256417 A1 | 10/2008 | Andersson |
| 2009/0031419 A1* | 1/2009 | Laksono ............ 726/21 |
| 2009/0044071 A1 | 2/2009 | Hoshino et al. |
| 2009/0092037 A1 | 4/2009 | Hadad |
| 2009/0204772 A1 | 8/2009 | Kolze |

FOREIGN PATENT DOCUMENTS

| | | |
|---|---|---|
| KR | 1020060007044 A | 1/2006 |
| KR | 1020060115291 A | 11/2006 |
| WO | 0235853 A2 | 5/2002 |
| WO | 2004049581 A2 | 6/2004 |
| WO | 2006007571 A1 | 1/2006 |
| WO | 2006020741 A2 | 2/2006 |
| WO | 2008111793 A1 | 9/2008 |

OTHER PUBLICATIONS

Clark, G.C., Jr. et al., "Error-Correction Coding for Digital Communications," Plenum Press, 1981, pp. 84-85, United States.

European Telecommunications Standards Institute (ETSI), "Digital Video Broadcasting (DVB); Framing structure, channel coding and modulation for digital terrestrial television (ETSI EN 300 744 V1.4.1 (Jan. 2001))," ETSI, Jan. 2001, pp. 1-49, France.

Examination Report dated Apr. 11, 2011 for European Application No. 08723427.4 from European Patent Office, pp. 1-6, Rijswijk, Netherlands.

Forney, G.D., Jr.,"Burst Correcting Codes for the Classic Bursty Channel," IEEE Trans. on Communications Technology, vol. 19, No. 5, IEEE, Oct. 1971, pp. 772-781, United States.

Freshnews.com, "SiBEAM Receives Equity Investment from Best Buy," FreshNews.com, Jan. 4, 2010, pp. 1-2, United States.

Hachman, M., "CE Giants back Amimon's Wireless HDTV Tech," ExtremeTech.com, Jul. 23, 2008, p. 1, United States.

Hassibi, B. et al., "How Much Training is Needed in Multiple-Antenna Wireless Links?", IEEE Transactions on Information Theory, vol. 49, No. 4, IEEE, Apr. 2003, pp. 951-963, United States.

International Preliminary Report on Patentability dated Jan. 15, 2009 for International Application No. PCT/KR2007/003129 from International Bureau, filed Jun. 28, 2007, pp. 1-8, Geneva, Switzerland.

International Search Report dated Jun. 17, 2008 for International Application No. PCT/KR2008/001390 from Korean Intellectual Property Office, p. 1, Seo-gu, Daejeon, Republic of Korea.

International Search Report dated Nov. 19, 2007 for International Application No. PCT/KR2007/003172 from Korean Intellectual Property Office, filed Jun. 29, 2007, pp. 1-3, Seo-gu, Daejeon, Republic of Korea.

International Search Report dated May 21, 2008 for International Application No. PCT/KR2008/000886 from Korean Intellectual Property Office, pp. 1-3, Seo-gu, Daejeon, Republic of Korea.

International Search Report dated Jun. 24, 2008 for International Application No. PCT/KR2008/001378 from Korean Intellectual Property Office, p. 1, Seo-gu, Daejeon, Republic of Korea.

Korean Notice of Allowance dated Jan. 25, 2010 for Korean Application No. 1020080021026, filed Mar. 6, 2008, 5 pages, Korea Patent Office, Republic of Korea.

LG Electronics Inc. et al., "WirelessHD Specification Version 1.0 Overview," LG Electronics Inc. et al., Oct. 9, 2007, pp. 1-77, United States.

Maruhashi, K. et al., "Wireless Uncompressed-HDTV-Signal Transmission System Utilizing Compact 60-GHz-band Transmitter and Receiver," 2005 IEEE MTT-S International Microwave Symposium Digest, Jun. 12-17, 2005, IEEE, 2005, pp. 1867-1870, United States.

Physorg.com, "NEC Develops Compact Millimeter-Wave Transceiver for Uncompressed HDTV Signal Transmission," PHYSorg.com, Apr. 1, 2005, pp. 1-2, United States.

Supplementary European Search Report dated Feb. 23, 2011 for European Application No. EP 08723427.4 from European Patent Office, pp. 1-2, Rijswijk, Netherlands.

Wireless Home Digital Interface (WHDI) Special Interest Group, "Full HD Quality and Reliable Connection", WHDI Special Interest Group, 2011, pp. 1-2, United States, downloaded from www.whdi.com on Jun. 7, 2011.

Xia, P. et al., "Achieving the Welch Bound With Difference Sets", IEEE Transactions on Information Theory, vol. 51, No. 5, IEEE, May 2005, pp. 1900-1907, New York, United States.

Xia, P. et al., "Adaptive MIMO-OFDM Based on Partial Channel State Information", IEEE Transactions on Signal Processing, vol. 52, No. 1, IEEE, Jan. 2004, pp. 1-12, United States.

U.S. Non-Final Rejection for U.S. Appl. No. 11/724,758 mailed Sep. 21, 2011.

U.S. Notice of Allowance for U.S. Appl. No. 11/724,758 mailed Jan. 27, 2012.

U.S. Non-Final Rejection for U.S. Appl. No. 11/863,084 mailed Sep. 1, 2010.

U.S. Notice of Allowance for U.S. Appl. No. 11/863,084 mailed Jan. 5, 2011.

U.S. Notice of Allowance for U.S. Appl. No. 11/863,084 mailed Mar. 14, 2011

U.S. Notice of Allowance for U.S. Appl. No. 11/863,084 mailed Jun. 28, 2011.

U.S. Notice of Allowance for U.S. Appl. No. 11/863,084 mailed Oct. 11, 2011.

U.S. Notice of Allowance for U.S. Appl. No. 11/863,109 mailed Nov. 6, 2009.

* cited by examiner

SYSTEM AND METHOD FOR DIGITAL COMMUNICATIONS USING MULTIPLE PARALLEL ENCODERS

CROSS-REFERENCE TO RELATED APPLICATIONS

This application is a continuation of U.S. patent application Ser. No. 11/724,758 filed on Mar. 15, 2007, which claims priority under 35 U.S.C. §119(e) from U.S. Provisional Patent Application No. 60/817,317 filed on Jun. 28, 2006, which are herein incorporated by reference. U.S. Ser. No. 11/724,758 is related to U.S. patent application Ser. No. 11/724,735 and U.S. patent application Ser. No. 11/724,760, which were concurrently filed with U.S. patent application Ser. No. 11/724,758 and are also herein incorporated by reference.

BACKGROUND OF THE INVENTION

1. Field of the Invention

The present invention relates to wireless transmission of video information, and in particular, to transmission of uncompressed high definition video information over wireless channels.

2. Description of the Related Technology

With the proliferation of high quality video, an increasing number of electronics devices (e.g., consumer electronics devices) utilize high-definition (HD) video, which has an overall data throughput requirement on the order of multiple giga bps. In most wireless communications, HD video is compressed first before transmitting to the wireless medium. Compression of the HD video is attractive because the overall required communication bandwidth and power can be significantly reduced, relative to transmission of the original, uncompressed video. However, with each compression and subsequent decompression of the video, some video information can be lost and the picture quality is degraded. Furthermore, compression and decompression of the video signal incurs significant hardware cost as well.

The High-Definition Multimedia Interface (HDMI) specification defines an interface for uncompressed HD transmission between devices through HDMI cables (wired links). Three separate channels are used to transmit three pixel component streams (e.g., R, B, G). For each channel, pixels are transmitted in a pixel-by-pixel order for each video line and line-by-line for each video frame or field. The HDMI provides pixel-repetition functionality which repeats each pixel one or multiple times. Copies of each pixel directly follow the original pixel during the transmission at each pixel component channel.

It is also desirable to transmit uncompressed HD video over the area in certain scenario. However, existing wireless local area networks (WLANs) and similar technologies do not have the bandwidth needed to support uncompressed HD video. Further, existing wireless networks may suffer from undesirable interference originated from nearby and neighboring users, either of the same network or of other networks.

SUMMARY OF CERTAIN INVENTIVE ASPECTS

One aspect of the invention provides a system for processing high definition video data to be transmitted over a wireless medium, the system comprising: i) a Reed Solomon (RS) encoder configured to encode a video data stream, and an outer-interleaver to reshuffle the coded bits ii) a parser configured to parse the RS encoded data stream into a plurality of sub-video data streams, iii) a plurality of convolutional encoders configured to encode in parallel the plurality of sub-video data streams so as to create a plurality of encoded data streams and iv) a multiplexer configured to input the plurality of encoded data streams and output a multiplexed data stream, wherein the multiplexed data stream is transmitted over the wireless medium, received and decoded at a receiver.

Another aspect of the invention provides a method of processing high definition video data to be transmitted over a wireless medium, the method comprising: i) Reed Solomon (RS) encoding a video data stream and interleaving ii) parsing the RS encoded data stream into a plurality of sub-video data streams, iii) convolutional encoding the plurality of sub-video data streams in parallel so as to create a plurality of encoded data streams and iv) multiplexing the plurality of encoded data streams so as to output a multiplexed data stream, wherein the multiplexed data stream is transmitted over the wireless medium, received and decoded at a receiver.

Another aspect of the invention provides a system for processing high definition video data to be transmitted over a wireless medium, the system comprising: i) a first Reed Solomon (RS) encoder configured to input the most (or more) significant bits (MSBs) of a video data stream, RS encode the MSBs, and output a first RS encoded data stream, followed by the first outer-interleaver which interleaves the first RS coded data stream ii) a second Reed Solomon (RS) encoder configured to input the least (or less) significant bits (LSBs) of the video data stream, RS encode the LSBs, and output a second RS encoded data stream, followed by the second outer-interleaver which interleaves the second RS coded data stream iii) a first parser configured to parse the first RS encoded data stream into a first plurality of sub-video data streams, iv) a second parser configured to parse the second RS encoded data stream into a second plurality of sub-video data streams, v) a first plurality of convolutional encoders configured to encode the first plurality of sub-video data streams in parallel and output a first plurality of convolutional encoded data streams, vi) a second plurality of convolutional encoders configured to encode the second plurality of sub-video data streams in parallel and output a second plurality of convolutional encoded data streams, vii) a multiplexer configured to input the first and the second plurality of convolutional encoded data streams and output an overall multiplexed data stream, which is then modulated and transmitted over the wireless medium, received and decoded at a receiver.

Still another aspect of the invention provides one or more processor-readable storage devices having processor-readable code embodied on the processor-readable storage devices, the processor-readable code for programming one or more processors to perform a method of processing high definition video data to be transmitted over a wireless medium, the method comprising: i) Reed Solomon (RS) encoding a video data stream, ii) parsing the RS encoded data stream into a plurality of sub-video data streams, iii) convolutional encoding the plurality of sub-video data streams in parallel so as to create a plurality of encoded data streams and iv) multiplexing the plurality of encoded data streams so as to output a multiplexed data stream, wherein the multiplexed data stream is transmitted over the wireless medium, received and decoded at a receiver.

Yet another aspect of the invention provides a system for processing high definition video data to be transmitted over a wireless medium, the system comprising: i) an outer encoder configured to encode a video data stream and an outer interleaver to interleave the encoded stream, ii) a parser configured to parse the encoded data stream into a plurality of sub-video data streams, iii) a plurality of inner encoders configured to encode the plurality of sub-video data streams in parallel so as to create a plurality of encoded data streams and iv) a multiplexer configured to input the plurality of encoded data streams and output a multiplexed data stream.

DETAILED DESCRIPTION OF CERTAIN INVENTIVE EMBODIMENTS

Certain embodiments provide a method and system for transmission of uncompressed HD video information from a sender to a receiver over wireless channels.

Example implementations of the embodiments in a wireless high definition (HD) audio/video (A/V) system will now be described.

Figure 1:
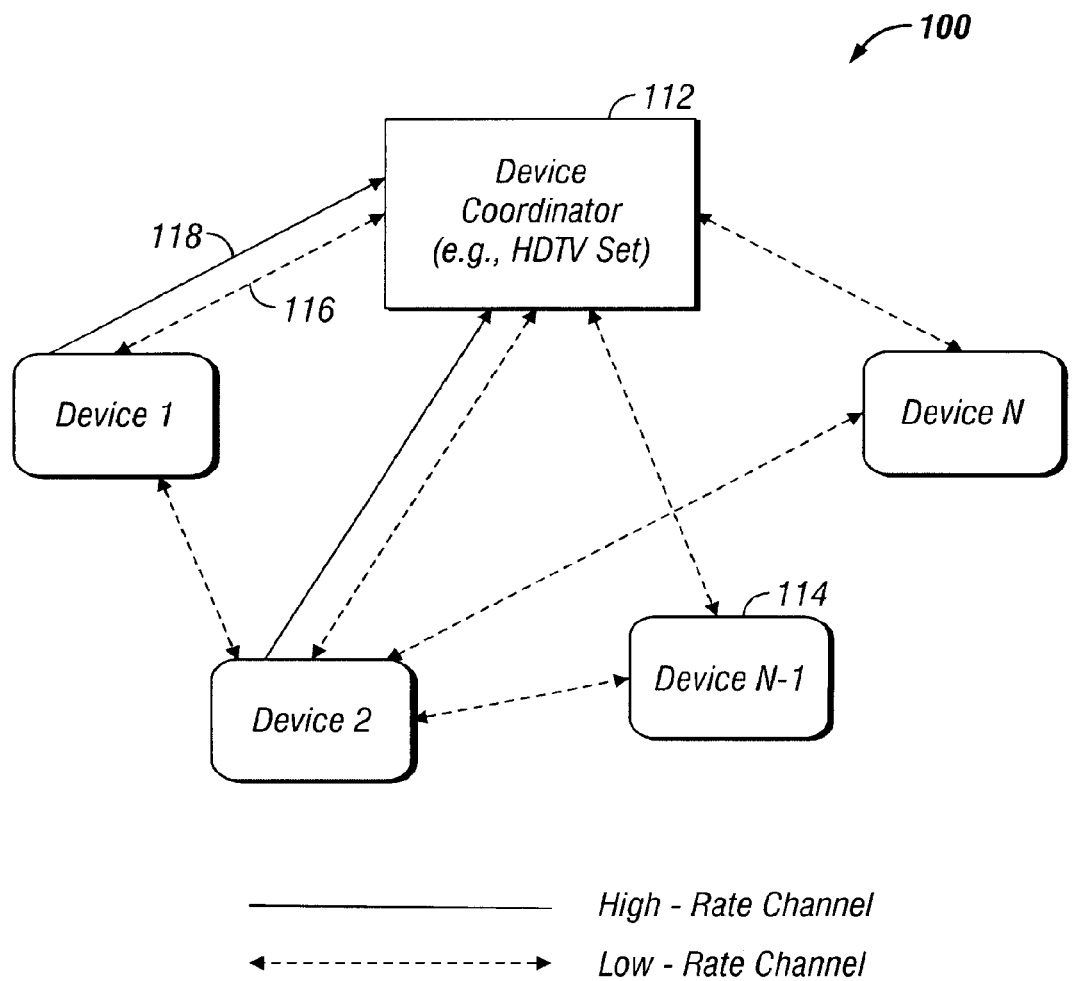
FIG. 1 is a functional block diagram of a wireless network that implements uncompressed HD video transmission between wireless devices according to one embodiment.

FIG. 1 shows a functional block diagram of a wireless network 100 that implements uncompressed HD video transmission between A/V devices such as an A/V device coordinator and A/V stations, according to certain embodiments. In other embodiments, one or more of the devices can be a computer, such as a personal computer (PC). The network 100 includes a device coordinator 112 and multiple A/V stations 114 (e.g., Device 1 . . . Device N). The A/V stations 114 utilize a low-rate (LR) wireless channel 116 (dashed lines in FIG. 1), and may use a high-rate (HR) channel 118 (heavy solid lines in FIG. 1), for communication between any of the devices. The device coordinator 112 uses a low-rate channel 116 and a high-rate wireless channel 118, for communication with the stations 114.

Each station 114 uses the low-rate channel 116 for communications with other stations 114. The high-rate channel 118 supports single direction unicast transmission over directional beams established by beamforming, with e.g., multi-GB/s bandwidth, to support uncompressed HD video transmission. For example, a set-top box can transmit uncompressed video to a HD television (HDTV) over the high-rate channel 118. The low-rate channel 116 can support bi-directional transmission, e.g., with up to 40 Mbps throughput in certain embodiments. The low-rate channel 116 is mainly used to transmit control frames such as acknowledgement (ACK) frames. For example, the low-rate channel 116 can transmit an acknowledgement from the HDTV to the set-top box. It is also possible that some low-rate data like audio and compressed video can be transmitted on the low-rate channel between two devices directly. Time division duplexing (TDD) is applied to the high-rate and low-rate channel. At any one time, the low-rate and high-rate channels cannot be used in parallel for transmission, in certain embodiments. Beamforming technology can be used in both low-rate and high-rate channels. The low-rate channels can also support omni-directional transmissions.

In one example, the device coordinator 112 is a receiver of video information (hereinafter "receiver 112"), and the station 114 is a sender of the video information (hereinafter "sender 114"). For example, the receiver 112 can be a sink of video and/or audio data implemented, such as, in an HDTV set in a home wireless network environment which is a type of WLAN. In another embodiment, the receiver 112 may be a projector. The sender 114 can be a source of uncompressed video or audio. Examples of the sender 114 include a set-top box, a DVD player or recorder, digital camera, camcorder, other computing device (e.g., laptop, desktop, PDA, etc.), and so forth.

Figure 2:
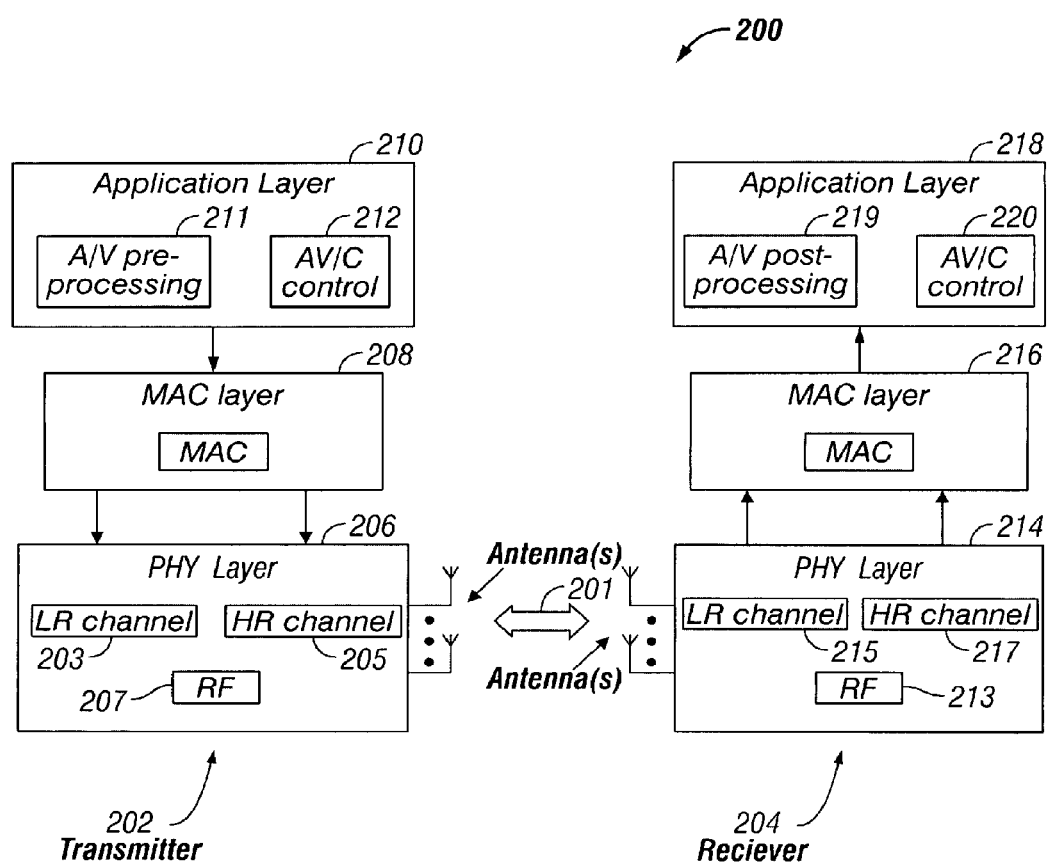
FIG. 2 is a functional block diagram of an example communication system for transmission of uncompressed HD video over a wireless medium, according to one embodiment.

FIG. 2 illustrates a functional block diagram of an example communication system 200. The system 200 includes a wireless transmitter 202 and wireless receiver 204. The transmitter 202 includes a physical (PHY) layer 206, a media access control (MAC) layer 208 and an application layer 210. Similarly, the receiver 204 includes a PHY layer 214, a MAC layer 216, and an application layer 218. The PHY layers provide wireless communication between the transmitter 202 and the receiver 204 via one or more antennas through a wireless medium 201.

The application layer 210 of the transmitter 202 includes an A/V pre-processing module 211 and an audio video control (AV/C) module 212. The A/V pre-processing module 211 can perform pre-processing of the audio/video such as partitioning of uncompressed video. The AV/C module 212 provides a standard way to exchange A/V capability information. Before a connection begins, the AV/C module negotiates the A/V formats to be used, and when the need for the connection is completed, AV/C commands are used to stop the connection.

In the transmitter 202, the PHY layer 206 includes a low-rate (LR) channel 203 and a high rate (HR) channel 205 that are used to communicate with the MAC layer 208 and with a radio frequency (RF) module 207. In certain embodiments, the MAC layer 208 can include a packetization module (not shown). The PHY/MAC layers of the transmitter 202 add PHY and MAC headers to packets and transmit the packets to the receiver 204 over the wireless channel 201.

In the wireless receiver 204, the PHY/MAC layers 214, 216 process the received packets. The PHY layer 214 includes a RF module 213 connected to the one or more antennas. A LR channel 215 and a HR channel 217 are used to communicate with the MAC layer 216 and with the RF module 213. The application layer 218 of the receiver 204 includes an A/V post-processing module 219 and an AV/C module 220. The module 219 can perform an inverse processing method of the module 211 to regenerate the uncompressed video, for example. The AV/C module 220 operates in a complementary way with the AV/C module 212 of the transmitter 202.

Error control coding is widely used in modern communication systems. For example, a Reed Solomon (RS) code concatenated with a convolutional code has been employed in protecting data against channel errors in many systems, such as "Digital Video Broadcasting; framing structure, channel coding and modulation for digital terrestrial television," ETSI EN 300 744, which is incorporated herein by reference. In typical communication applications, the data throughput is not very high, and at the receiver side, one RS decoder concatenated with one Viterbi algorithm (popular decoding algorithm for the convolutional code) is generally able to handle the decoding task. However, this is not the case for wireless HD (WiHD) technology, where the targeted data throughput is on the order of about 4 Giga bits per second. In one embodiment, considering the fact that current Viterbi throughput is typically on the order of about 500 Mega bits per second, multiple parallel Viterbi decoders are used at the receiver to complete the decoding task. In this situation, when a single encoder is used at a WiHD video transmitter, each of the multiple decoders needs to communicate data with each other because the information of one decoder is interrelated to the information of the remaining decoders. This makes the decoder design more complicated. Furthermore, communicating with other decoders can cause large overall decoding delay at a WiHD receiver.

Figure 3:
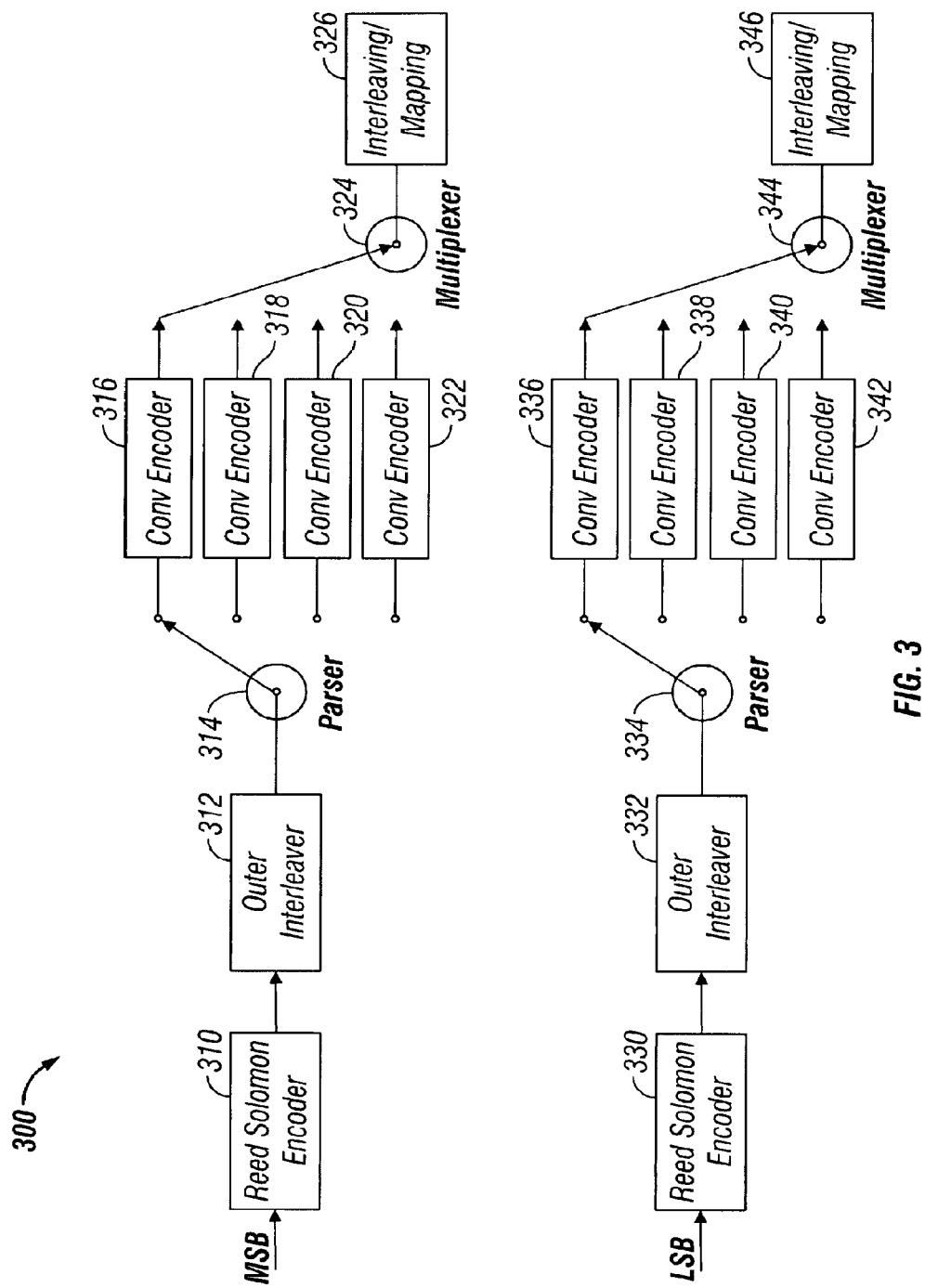
FIG. 3 illustrates an exemplary wireless HD video transmitter system according to one embodiment of the invention.

FIG. 3 illustrates an exemplary wireless HD video transmitter system 300 according to one embodiment of the invention. The system 300 includes RS encoders 310 and 330, outer interleavers 312 and 332, parsers 314 and 334, a first plurality of convolutional encoders 316-322 and a second plurality of convolutional encoders 336-342, multiplexers 324 and 344 and interleaving/mapping units 326 and 346. In one embodiment, all of the elements of the FIG. 3 system belong to the PHY layer 206 (see FIG. 2). Although eight encoders are illustrated in FIG. 3, there may be more encoders (e.g., 16 or greater) or less encoders (e.g., 2 or 4) depending on specific applications. In another embodiment, it is also possible to have a single RS encoder, a single outer interleaver, a single parser and a single multiplexer. In this embodiment, the single parser, instead of having one input and four outputs as each of the parsers 314/334 does, will have one input and eight outputs. In another embodiment, other encoder (or outer encoder), for example, a BCH code, may be used for encoding instead of the RS encoders 310 and 330.

In one embodiment, the elements 310-326 are used to process most significant bits (MSBs) and the elements 330-346 are used to process least significant bits (LSBs). It is known that for color reproduction the loss of LSBs in a communication channel is of less concern than loss of MSBs. Therefore, certain embodiments can provide a greater degree of protection through, e.g., different error codings for each of MSBs and LSBs. This technique is known as unequal error protection (UEP). In one embodiment, all of the elements of the FIG. 3 system can be embodied by either software or hardware or a combination.

The RS encoders 310, 330 and outer interleavers 312, 332 perform RS encoding and interleaving on incoming bit streams (MSBs and LSBs, respectively). The parsers 314, 334 parse the interleaved bit streams into the first group of convolutional encoders 316-322 (for MSBs) and into the second group of convolutional encoders 336-342 (for LSBs), respectively. In one embodiment, the parsers 314, 334 are a switch or demultiplexer which parses data bit-by-bit or group-by-group (with the group size, number of bits in a group being not fixed). In one embodiment, each of the outer interleavers 312, 332 is a block interleaver, a convolutional interleaver or an arbitrary interleaver which shuffles the order of the input data streams. In another embodiment, other forms of interleavers are also possible. In one embodiment, the RS encoders 310, 330, outer interleavers 312, 332 and the encoders 316-322 and 336-342 together perform the forward error correction (FEC) described with respect to FIG. 2.

In one embodiment, the convolutional (or inner) encoders 316-322 and 336-342 are configured to provide unequal error protection (UEP) depending on the relative importance of incoming data bits. As discussed above, the first encoders 316-336 may encode MSB data and the second encoders 336-342 may encode LSB data. In this example, the MSB encoding provides better error protection than the LSB encoding. In another embodiment, the convolutional encoders 316-342 are configured to provide equal error protection (EEP) for all incoming data bits. The multiplexers 324, 344 combine the bit streams of the encoders 316-322 and 336-342, respectively. The interleaving/mapping units 326, 346 perform interleaving/mapping on the outputs of the multiplexers 324, 344, respectively. After the interleaving/mapping, the OFDM modulation, e.g., including inverse Fourier Fast Transform (IFFT) processing, and beamforming may be performed before transmitting the data packet to a WiHD video data receiver over the wireless channel 201 (see FIG. 2). In one embodiment, the WiHD video data receiver may include a plurality of parallel convolutional decoders corresponding to the plurality of convolutional encoders 316-322 and 336-342.

Figure 4:
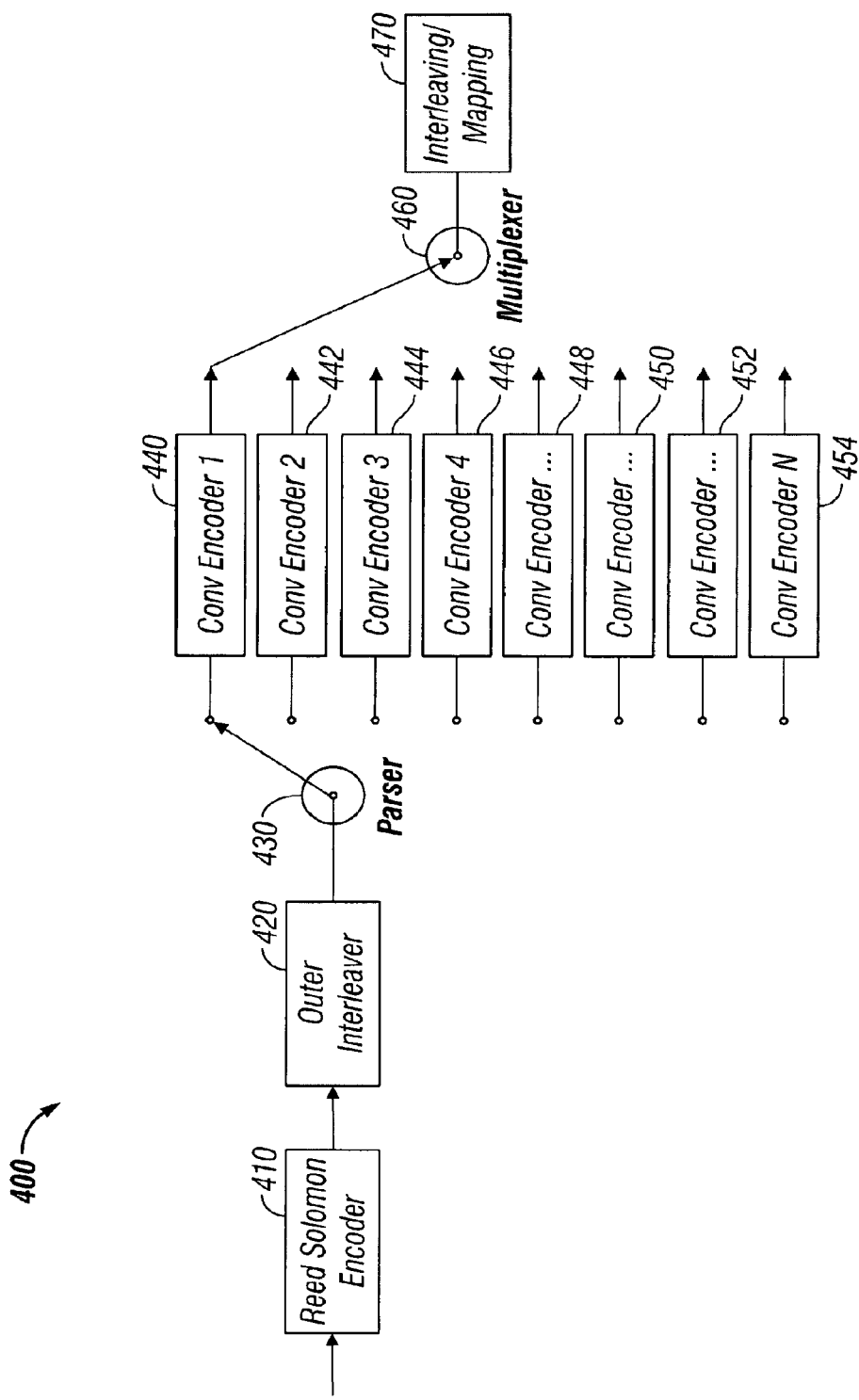
FIG. 4 illustrates an exemplary wireless HD video transmitter system according to another embodiment of the invention.

FIG. 4 illustrates an exemplary wireless HD video transmitter system 400 according to another embodiment of the invention. The system 400 includes an RS encoder 410, an outer interleaver 420, a parser 430, a plurality of convolutional encoders 440-454, a multiplexer 460 and an interleaving/mapping unit 470. In one embodiment, all of the elements of the FIG. 4 system belong to the PHY layer 206 (see FIG. 2). Although eight encoders are illustrated in FIG. 3, there may be more encoders (e.g., 16 or greater) or less encoders (e.g., 2 or 4) depending on specific applications. In one embodiment, the RS encoder 410, the outer interleaver 420, the parser 430, the multiplexer 460 and the interleaving/mapping unit 470 are substantially the same as those of FIG. 3. In one embodiment, the encoders 440-454 are configured to provide equal error protection (EEP) for all incoming data bits.

Figure 5:
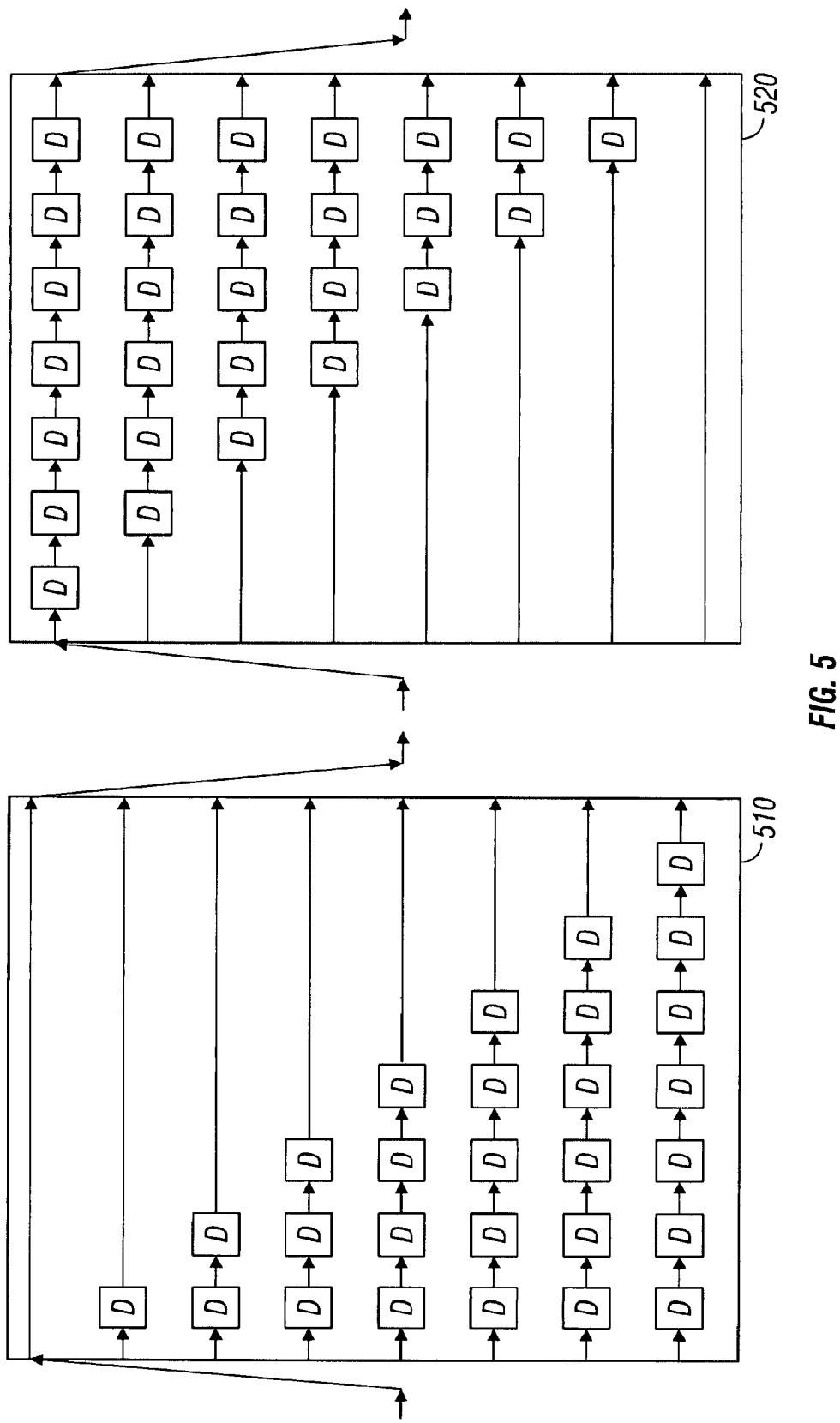
FIG. 5 illustrates an outer interleaver at a transmitter site and an outer deinterleaver at a receiver site according to one embodiment of the invention.
Figure 6:
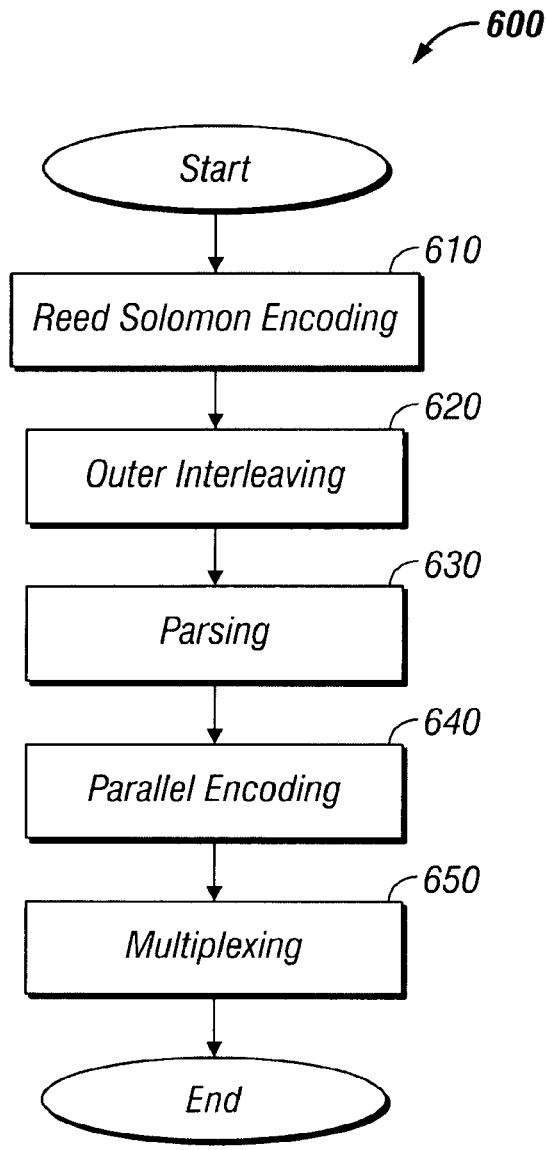
FIG. 6 illustrates an exemplary flowchart which shows a wireless HD video transmitting procedure according to one embodiment of the invention.

Hereinafter, referring to FIG. 6, the operation of the systems 300 and 400 will be described. FIG. 5 will be discussed below. FIG. 6 illustrates an exemplary flowchart which shows a wireless HD video transmitting procedure 600 according to one embodiment of the invention. In one embodiment, the transmitting procedure 600 is implemented in a conventional programming language, such as C or C++ or another suitable programming language. In one embodiment of the invention, the program is stored on a computer accessible storage medium at a WiHD transmitter which is a part of or attached to a station, for example, a device coordinator 112 or devices (1-N) 114 as shown in FIG. 1. In another embodiment, the program can be stored in other system locations so long as it can perform the transmitting procedure 600 according to embodiments of the invention. The storage medium may comprise any of a variety of technologies for storing information. In one embodiment, the storage medium comprises a random access memory (RAM), hard disks, floppy disks, digital video devices, compact discs, video discs, and/or other optical storage mediums, etc.

In another embodiment, at least one of the device coordinator 112 and devices (1-N) 114 comprises a processor (not shown) configured to or programmed to perform the transmitting procedure 600. The program may be stored in the processor or a memory of the coordinator 112 and/or the devices (1-N) 114. In various embodiments, the processor may have a configuration based on Intel Corporation's family of microprocessors, such as the Pentium family and Microsoft Corporation's Windows operating systems such as Windows 95, Windows 98, Windows 2000 or Windows NT. In one embodiment, the processor is implemented with a variety of computer platforms using a single chip or multichip microprocessors, digital signal processors, embedded microprocessors, microcontrollers, etc. In another embodiment, the processor is implemented with a wide range of operating systems such as Unix, Linux, Microsoft DOS, Microsoft Windows 2000/9x/ME/XP, Macintosh OS, OS/2 and the like.

In another embodiment, the transmitting procedure 600 can be implemented with an embedded software. Depending on the embodiments, additional states may be added, others removed, or the order of the states changes in FIG. 6.

In state 610, RS encoding is performed on the incoming data streams. In one embodiment, on each stream, raw bits are first encoded by the RS encoders 310, 330 as shown in the system of FIG. 3. In another embodiment, a single RS encoder 410 is used to encode the entire raw data information without splitting it into two separate streams, as illustrated in the system of FIG. 4.

In one embodiment, an RS code (n; 224, k; 220, t; 2) is used to RS encode the received data streams, where information data length k=220 bytes, coded data length n=224 bytes and error correction capability t=2 bytes. Equations (1)-(4) below show exemplary polynomials for RS encoding. In one embodiment, the RS code (224, 220, 2) is obtained by shortening an RS code (255, 251, 2), which has symbols in the Galois field GF (256), with the primitive polynomial being.

$$p(x)=1+x^2+x^3+x^4+x^8. \quad (1)$$

The codeword generator polynomial is chosen as $$g_2(x)=x^4+\alpha^{76}x^3+\alpha^{251}x^2+\alpha^{81}+\alpha^{10}. \quad (2)$$

In one embodiment, the shortened RS code can be implemented by adding 31 bytes of zeros before the length-220 raw data bytes at the input of an RS encoder having an RS code (255, 251, 2). After the RS encoding procedure, the 31 null bytes are discarded. In one embodiment, the same RS encoder is used on both data streams (i.e., MSBs and LSBs)

In another embodiment, instead of the above RS code (224, 220, 2), an RS code (n; 224, k; 218, t; 3) can be used, where information data length k=218 bytes, coded data length n=224 bytes and error correction capability t=3 bytes. In another embodiment, an RS code (n; 224, k; 216, t; 4) can be also used. In one embodiment, the RS code (224, 218, 3) is obtained by shortening an RS code (255, 251, 3), which has symbols in the Galois field GF (256), with the primitive polynomial being $$p(x)=1+x^2+x^3+x^4+x^8. \quad (3)$$

The generator polynomial is chosen as $$g_3(x)=x^6+\alpha^{167}x^5+\alpha^{122}x^4+\alpha^{134}x^3+\alpha^{34}x^2+\alpha^{181}x+\alpha^{21}. \quad (4)$$

In one embodiment, the shortened RS code can be implemented by adding 31 bytes of zeros before the length-218 raw data bytes at the input of an RS encoder having an RS code (255, 249, 3). After the RS encoding procedure, the 31 null bytes are discarded. Again, the same RS code may be used for both streams of MSBs and LSBs. It is appreciated that the above-described RS codes are merely examples, and other RS codes can be used.

Outer interleaving is performed on the output of the RS encoders (620). In one embodiment as shown in FIG. 3, the same outer interleaver is used on both data streams (MSBs, LSBs). In another embodiment, the outer interleavers on the two branches can be different. In one embodiment, an outer interleaver 510 (at a WiHD video transmitter) and a corresponding deinterleaver 520 (at a WiHD video receiver) as shown in FIG. 5 are used. In another embodiment, interleavers and corresponding deinterleavers having different configuration can also be used. In one embodiment, the convolutional outer interleaver is described in G. Formey, "Burst Correcting Codes for Classic Bursty Channel," IEEE Trans. on Communications Technology, vol. 19, no. 5, October 1971, which is incorporated by reference. In this embodiment, the interleaver is composed of I=8 branches, cyclically connected to the input byte-streams. In one embodiment, each branch is a first-in first-out (FIFO) shift register with delay jD, where D=28 is the delay per delay unit and j is the branch index. The cells of the FIFO may contain 1 byte. The parameters I=8, D=28 are only an example. Other parameters can be used depending on different situations. Also, here, the outer interleaver is not necessarily a convolutional interleaver, and it can be an arbitrary interleaver with arbitrary interleaving pattern.

The outer interleaved bit streams are parsed into multiple parallel convolutional encoders (630). In one embodiment, the output is parsed into N branches, with each branch encoded by a separate convolutional encoder. In one embodiment, N=4 (2N=8) is used for the system of FIG. 3. In another embodiment, N=8 is used for the system of FIG. 4. In one embodiment, the parser 508 parses the received pixels in a bit-by-bit or group-by-group manner. The group size depends on the input video format and/or specific applications. In one embodiment, the input video format is pixel by pixel. In another embodiment, the input video data is retrieved from, e.g., three memories which include data for one color, e.g., red, green and blue, respectively. A detailed description regarding the operation of a group parser is explained in U.S. patent application Ser. No. 11/724,735 entitled "System and method for digital communications having parsing scheme with parallel convolutional encoders" concurrently filed as this application, which is incorporated by reference.

Parallel encoding is performed on the parsed bit streams (640). Typical video pixels have three colors R, G and B, with each color of a pixel carrying 8 bits of information, resulting into 24 bits per pixel in total. In one embodiment, each bit of the data is equally protected (EEP). In another embodiment, each bit of the data is unequally protected (UEP).

In one embodiment, as shown in FIG. 3, raw data information is first split into two data streams, with bits 7, 6, 5, 4 going to the first stream (see the elements 310-326) and bits 3, 2, 1, 0 going to the second stream (see the elements 330-346). For 8 bits per color per pixel, bits 7, 6, 5, 4 are normally classified as MSBs and bits 3, 2, 1, 0 are normally classified as LSBs. In one embodiment, there is no priority difference between colors R, G and B.

In another embodiment, as shown in FIG. 4, raw data information is directly split into eight branches, with each bit going to one branch. In one embodiment, there is no priority difference between colors R, G and B. In the UEP case, most significant bits (MSBs) are to be more strongly protected than least significant bits (LSBs). These two data streams are unequally protected via choice of different convolutional codes or puncturing patterns. In this embodiment, one code is adopted by the N branches of the first stream (MSBs; 7, 6, 5, 4), and the other code is adopted by the N branches of the second stream (LSBs; 3, 2, 1, 0). In one embodiment, the two different codes can be generated from the same mother code, through different puncturing patterns. Or, the two different codes can be generated from different mother codes. In the EEP case, most significant bits (MSBs) are to be as strongly protected as least significant bits (LSBs). These two data streams are equally protected via the choice of same convolutional codes or puncturing patterns. In another embodiment, more important bits (can include MSBs but are not necessarily limited to MSBs) can be more strongly protected than less important bits (can include LSBs but are not necessarily limited to LSBs).

After convolutional encoding over each branch, the coded data bits are multiplexed together (650). In one embodiment, the outputs of the 2N (=8) convolutional encoders as shown in FIG. 3 are then multiplexed together and fed into the interleaving/mapping units 326, 346. In another embodiment, the output of the N (=8) convolutional encoders as shown in FIG. 4 are multiplexed together and provided to the interleaving/mapping unit 470. The detailed multiplexing operation can be found in U.S. patent application U.S. patent application Ser. No. 11/724,760 entitled "System and method for digital communications having puncture cycle based multiplexing scheme with unequal error protection (UEP)," concurrently filed as this application, which is incorporated by reference.

One embodiment of the invention provides strong error protection for data communications at very high throughput, and makes parallel Viterbi decoding implementation easier at a WiHD receiver. For example, because the decoders do not need to communicate data with each other while decoding, large decoding delay can be significantly reduced at the receiver side. Furthermore, it supports both equal error protection and unequal error protection capability for video transmissions.

While the above description has pointed out novel features of the invention as applied to various embodiments, the skilled person will understand that various omissions, substitutions, and changes in the form and details of the device or process illustrated may be made without departing from the scope of the invention. For example, although embodiments of the invention have been described with reference to uncompressed video data, those embodiments can be applied to compressed video data as well. Furthermore, instead of a convolutional encoder, other inner encoder (e.g., linear block encoder) may be used. Therefore, the scope of the invention is defined by the appended claims rather than by the foregoing description. All variations coming within the meaning and range of equivalency of the claims are embraced within their scope.

What is claimed is:

1. A method for receiving a high definition video data stream over a wireless medium, the method comprising:
    receiving and decoding a multiplexed data stream encoded by a process including:
        encoding a first portion of a video data stream by a first encoder;
        encoding a second portion of the video data stream by a second encoder;
        parsing the encoded first portion of the data stream by a first parser into a first plurality of sub-video data streams;
        parsing the encoded second portion of the data stream by a second parser into a second plurality of sub-video data streams; and
        convolutional encoding the first and second plurality of sub-video data streams in parallel so as to create a plurality of encoded data streams by a first and second plurality of convolutional encoders; and,
        inputting the plurality of encoded data streams and outputting a multiplexed data stream.

2. The method of claim 1, wherein the convolutional encoding comprising encoding the most significant bits with an encoding rate different from that for the least significant bits.

3. The method of claim 1, wherein the first encoder and the second encoder are Reed Solomon (RS) encoders.

4. The method of claim 1, wherein the convolutional encoding provides unequal error protection for incoming data bits depending on their relative importance.

5. The method of claim 1, wherein the convolutional encoding provides equal error protection for incoming data bits depending on their relative importance.

6. The method of claim 1, wherein the multiplexed data stream is uncompressed.

7. The method of claim 1, wherein the multiplexed data stream is received over the wireless medium, and decoded at a receiver.

8. A transmitter for transmitting high definition video data in an uncompressed format over a wireless medium, the transmitter comprising:
    a first encoder that encodes a first portion of a video data stream;
    a second encoder that encodes a second portion of the video data stream;
    a first parser that parses the first encoded data stream into a first plurality of sub-video data streams;
    a second parser that parses the second encoded data stream into a second plurality of sub-video data streams; and
    a convolutional encoding module for convolutional encoding the first plurality of sub-video data streams and the second plurality of sub-video data streams; and
    a multiplexer that inputs the first and second plurality of convolutional encoded data streams and outputs a single multiplexed data stream for transmitting over the wireless medium.

9. The transmitter of claim 8, wherein the convolutional module comprises:
    a first plurality of convolutional encoders that encode the first plurality of sub-video data streams in parallel and output a first plurality of convolutional encoded data streams; and
    a second plurality of convolutional encoders that encode the second plurality of sub-video data streams in parallel and output a second plurality of convolutional encoded data streams.

10. The transmitter of claim 8, wherein the first encoder comprises a first Reed Solomon (RS) encoder and the second encoder comprises a second RS encoder.

11. The transmitter of claim 10, wherein the first RS encoder inputs the most significant bits (MSBs) of the video data stream, RS encodes the MSBs, and outputs a first RS encoded data stream; and
    the second RS encoder inputs the least significant bits (LSBs) of the video data stream, RS encodes the LSBs, and outputs a second RS encoded data stream.

12. The transmitter of claim 11, further comprising:
    a first outer interleaver that performs interleaving on the output of the first RS encoder and provides the interleaved data to the first parser; and
    a second outer interleaver that performs interleaving on the output of the second RS encoder and provide the interleaved data to the second parser.

13. The transmitter of claim 12 wherein each of the first and second outer interleavers includes I branches, cyclically connected to input byte-streams, and wherein each branch is a first-in first-out (FIFO) shift register with delay jD, where D is delay per a delay unit and j is a branch index.

14. An encoder for processing high definition video data to be transmitted over a wireless medium, the encoder comprising:
    a first outer encoder that encodes a first portion of a video data stream comprising first significant bits;
    a second outer encoder that encodes a second portion of the video data stream comprising second significant bits;
    a first parser that parses the first encoded data stream into a first plurality of sub-video data streams;
    a second parser that parses the second encoded data stream into a second plurality of sub-video data streams; and a first and second plurality of inner convolutional encoders that encode the first plurality and second plurality of sub-video data streams in parallel for creating a plurality of encoded data streams.

15. The encoder of claim 14, further comprising:
a multiplexer that inputs the plurality of encoded data streams and outputs a multiplexed data stream.

16. The encoder of claim 15, wherein the outer encoder is a Reed Solomon encoder or a Bose-Chaudhuri-Hochquenghem (BCH) encoder.

17. The encoder of claim 16, wherein each of the inner encoders is a convolutional encoder or a linear block encoder.

18. The encoder of claim 14, wherein the first significant bits comprise most significant bits (MSBs) and the second significant bits comprise least significant bits (LSBs).

19. A wireless receiver for receiving high definition video data transmitted over a wireless medium, the receiver comprising:
an RF unit that receives encoded data streams over the wireless medium; and
a plurality of parallel convolutional decoders for decoding a data stream encoded by a first Reed Solomon (RS) encoder that encoded a first portion of the video data stream comprising first significant bits, and a second RS encoder that encoded a second portion of the video data stream comprising second significant bits, wherein the data stream is further encoded by a first plurality of inner convolutional encoders that encode a first plurality of sub-video data streams and a second plurality of inner convolutional encoders that encode a second plurality of sub-video data streams.

20. The wireless receiver of claim 19, wherein the first and the second plurality of inner convolutional encoders encode the first and the second plurality of sub-video data streams in parallel.

21. The wireless receiver of claim 20, wherein the receiver is a HDTV set or a projector.

22. The wireless receiver of claim 21, wherein the wireless receiver is implemented with one of the following: a set-top box, a DVD player or recorder, a digital camera, a camcorder and other computing device.

23. The wireless receiver of claim 20, wherein the number of the first and second plurality of convolutional encoders is 8, wherein the first four convolutional encoders encode four most significant bits of the first plurality of sub-video data streams and the remaining four convolutional encoders encode four least significant bits of the second plurality of sub-video data streams, and wherein the first four and the remaining four convolutional encoders use different convolutional codes.

24. The wireless receiver of claim 19, wherein the first significant bits comprise most significant bits (MSBs) and the second significant bits comprise least significant bits (LSBs).

25. A method for encoding video data streams, comprising:
encoding a first portion of a video data stream by a first encoder;
encoding a second portion of the video data stream by a second encoder;
parsing the encoded first portion of the data stream by a first parser into a first plurality of sub-video data streams;
parsing the encoded second portion of the data stream by a second parser into a second plurality of sub-video data streams; and
convolutional encoding the first and second plurality of sub-video data streams in parallel to create a plurality of encoded data streams by a first and second plurality of convolutional encoders.

* * * * *